United States Patent [19]
Ilcisin et al.

[11] Patent Number: 5,990,619
[45] Date of Patent: Nov. 23, 1999

[54] ELECTRODE STRUCTURES FOR PLASMA ADDRESSED LIQUID CRYSTAL DISPLAY DEVICES

[75] Inventors: Kevin J. Ilcisin, Beaverton, Oreg.; Paul C. Martin, Vancouver, Wash.; Thomas S. Buzak, Beaverton, Oreg.

[73] Assignee: Tektronix, Inc., Wilsonville, Oreg.

[21] Appl. No.: 08/802,962

[22] Filed: Feb. 21, 1997

Related U.S. Application Data

[60] Provisional application No. 60/014,299, Mar. 28, 1996.

[51] Int. Cl.$^6$ ........................ H01J 17/49
[52] U.S. Cl. ............... 313/584; 313/622; 345/60; 345/87
[58] Field of Search ............... 313/581, 582, 313/584, 585, 586, 587, 631, 632, 633; 345/67, 80

[56] References Cited

U.S. PATENT DOCUMENTS

| | | | |
|---|---|---|---|
| 4,896,149 | 1/1990 | Buzak et al. | 340/794 |
| 5,453,660 | 9/1995 | Martin et al. | 313/582 |
| 5,783,906 | 7/1998 | Moore et al. | 313/584 |

*Primary Examiner*—Sandra O'Shea
*Assistant Examiner*—Matthew J. Gerike
*Attorney, Agent, or Firm*—John D. Winkelman; Richard B. Preiss

[57] ABSTRACT

A plasma addressed liquid crystal display system (10) includes improved electrode structures (90, 100, 130) that are nonuniform parallel to their surfaces and may also be nonuniform perpendicular to their major surfaces. The nonuniformities include surface nonuniformities (92, 94), bulk nonuniformities (108, 110, 112, 112), and geometric nonuniformities (132, 134). Electrodes having such nonuniformities provide localized sites of preferential and nonpreferential surface and bulk properties of the electrodes, which, in turn, provide improved and locally tailored plasma discharge characteristics. PALC displays having the nonuniform electrodes have improved quality because of reduced firing voltages in one plasma channel region compared to another, reduced sputtering damage, reduced total current between electrodes, decreased discharge initiation time, and decreased ionized gas decay time.

19 Claims, 4 Drawing Sheets

ELECTRODE STRUCTURES FOR PLASMA ADDRESSED LIQUID CRYSTAL DISPLAY DEVICES

CROSS REFERENCE TO RELATED APPLICATIONS

This application claims the benefit of U.S. Provisional application Ser. No. 60/014,299, filed Mar. 28, 1996.

TECHNICAL FIELD

This invention relates to electronic image display devices and, more particularly, to electrode structures for a plasma addressed display.

BACKGROUND OF THE INVENTION

Systems employing data storage elements include, for example, video cameras and image displays. Such systems employ an addressing structure that provides data to or retrieves data from the storage elements. One system of this type to which one embodiment of this invention is particularly directed is a general purpose flat panel display having storage or display elements that store light pattern data. Flat panel-based display systems present a desirable alternative to the comparatively heavy, bulky, and high-voltage cathode-ray tube-based systems.

A flat panel display comprises multiple display elements or "pixels" distributed throughout the viewing area of a display surface. In a liquid crystal flat panel display the optical behavior of each pixel is determined by the magnitude of the electrical potential gradient applied across it. It is generally desirable in such a device to be able to set the potential gradient across each pixel independently. Various schemes have been devised for achieving this end. In currently available active matrix liquid crystal arrays there is, generally, a thin film transistor for every pixel. This transistor is typically strobed "on" by a row driver line at which point it will receive a value from a column driver line. This value is stored until the next row driver line strobe. Transparent electrodes on either side of the pixel apply a potential gradient corresponding to the stored value across the pixel, determining its optical behavior.

U.S. Pat. No. 4,896,149 describes the construction and operation of an alternative type of active matrix liquid crystal array, referred to as a plasma addressed liquid crystal ("PALC") display. This technology avoids the cumbersome and restrictive use of a thin film transistor for every pixel. Each pixel of the liquid crystal cell is positioned between a thin dielectric barrier and a conductive surface. On the opposed side of the thin barrier an inert gas is stored that may be selectively switched from a nonionized, nonconductive state to an ionized conductive plasma through the application of a sufficient electrical potential gradient across the gas volume.

When the gas is in a conductive state, it effectively sets the surface of the thin barrier to ground potential. In this state, the electrical potential across the pixel and thin dielectric barrier is equal to whatever voltage appears on the conductive surface. After the voltage across the gas volume is removed, the ionizable gas reverts to a nonconductive state. The potential gradient introduced across the pixel is stored by the natural capacitances of the liquid crystal material and the dielectric barrier. This potential gradient remains constant regardless of the voltage level of the conductive surface because the thin barrier voltage will float at a level below that of the conductive surface by the difference that was introduced while it was grounded.

Viewed on a larger scale, a PALC display includes a set of channels formed in an insulating plate and containing inert gas under a top plate that contacts the tops of the ribs forming the channel and is sealingly connected around the periphery with the insulating plate. Parallel electrodes extend along the length of each channel at opposed sides. During operation, the gas is ionized and thereby rendered a conductive plasma by the introduction of a large potential gradient between opposed electrodes. This operation occurs many times per second while the display is in operation.

Proper operation and manufacturability of a PALC display depends to a large degree on the electrical and physical properties of the electrodes. For example, to avoid differences in electrical potential along the length of the electrodes during the ionization of the gas, it is desirable that the resistance per unit length of the electrodes be no more than 2 ohms per centimeter (5 ohms per inch). To achieve this small value of resistance per unit length with the tiny cross-sectional area that is available for the electrodes, highly conductive metals such as gold, silver, copper, and aluminum are used.

However, such metals are prone to oxidation and life-reducing sputtering problems. To reduce fabrication costs and prevent sputtering and other problems, copper electrodes are typically employed that are covered with one or more coatings that resist oxidation and sputtering. Other coatings may also be applied to limit discharge current, uniformly distribute the discharge current, improve electrode emission, reduced ionization voltages, decrease discharge initiation time, and decrease ionized gas decay time.

The coatings are applied uniformly to the entire electrode or electrodes and, therefore, do not solve manufacturability or operational problems that are localized to a particular portion of an electrode, such as an end, center, or edge. Moreover, with so many coatings, manufacturing costs and fabrication problems are increased and situations may exist in which certain coatings interact with or reduce the effectiveness of other coatings.

What is needed, therefore, are electrode structures that are readily manufacturable, have low resistances per unit of length, and provide solutions to a variety of electrode-related manufacturing and operational problems, many of which may be localized to particular portions of the electrodes.

SUMMARY OF THE INVENTION

An object of this invention is, therefore, to provide electrode structures that provide solutions to a variety of electrode-related operational problems, particularly problems that are localized to particular portions of the electrodes.

Another object of this invention is to provide such electrode structures in a PALC display.

A further object of this invention is to provide methods of making such electrode structures.

Preferred embodiments of this invention provide PALC display electrode structures that are nonuniform parallel to their surfaces and may also be nonuniform perpendicular to their major surfaces. The nonuniformities include surface nonuniformities, bulk nonuniformities, and geometric nonuniformities. Electrodes having such nonuniformities provide localized sites of preferential and non-preferential surface and bulk qualities of the electrodes, which, in turn, provide improved and locally tailored plasma discharge characteristics. PALC displays having the nonuniform electrodes have improved quality because of reduced firing voltages in one plasma channel region compared to another, reduced sputtering damage, reduced total plasma discharge current, decreased discharge initiation time, and decreased ionized gas decay time.

Additional objects and advantages of this invention will be apparent from the following detailed description of preferred embodiments thereof, which proceeds with reference to the accompanying drawings.

DETAILED DESCRIPTION OF PREFERRED EMBODIMENTS

Figure 1:
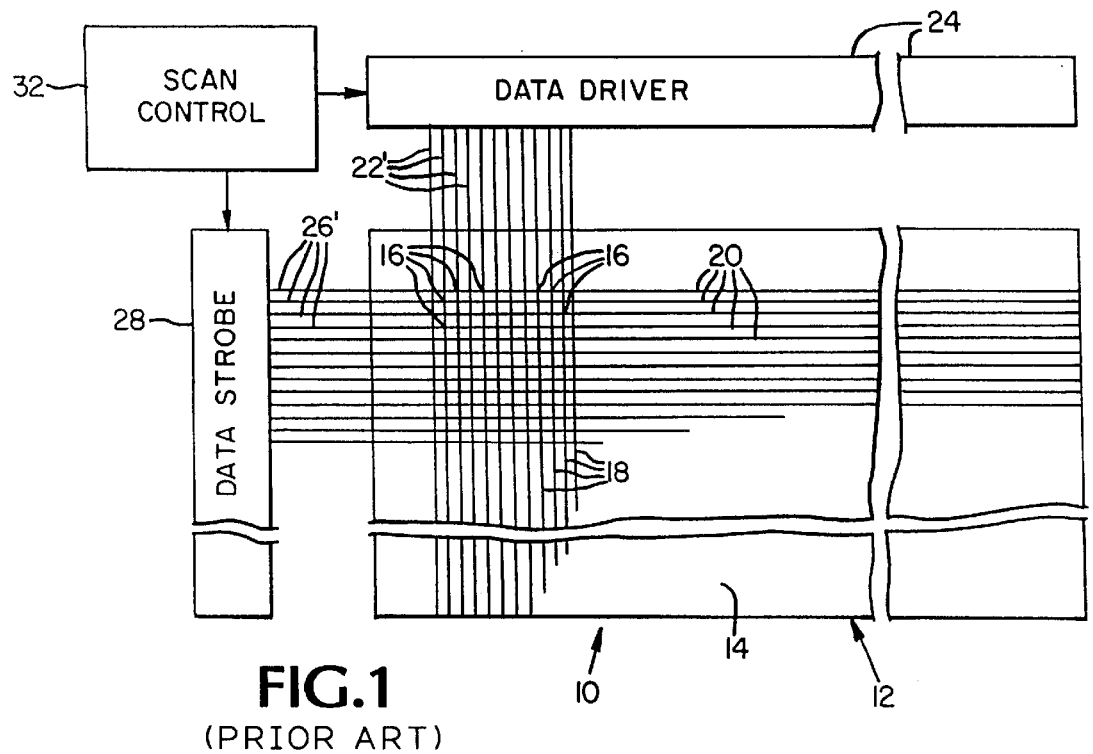
FIG. 1 is a diagram showing a frontal view of the display surface of a prior art display panel and associated drive circuitry of a plasma addressing structure in which this invention could be employed.
Figure 2:
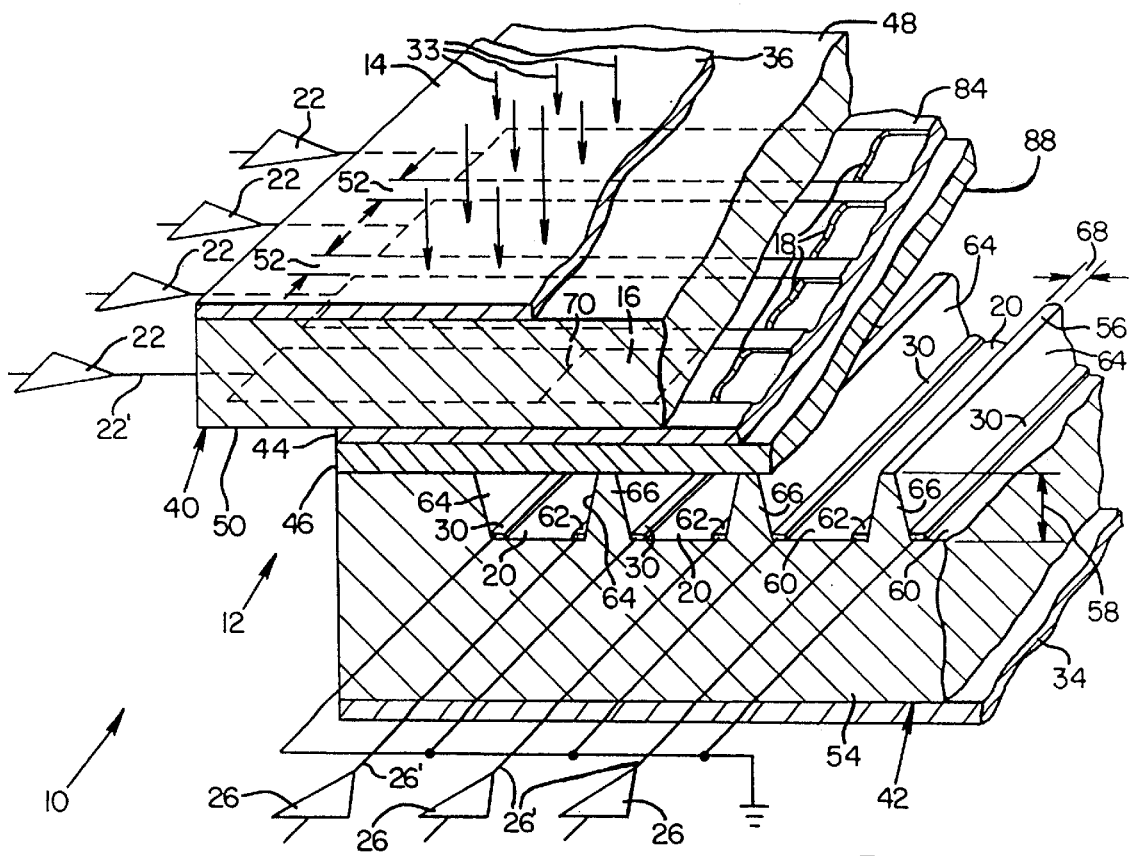
FIG. 2 is an enlarged fragmentary isometric view showing the layers of structural components forming the prior art display panel as viewed from the left side in FIG. 1.
Figure 3:
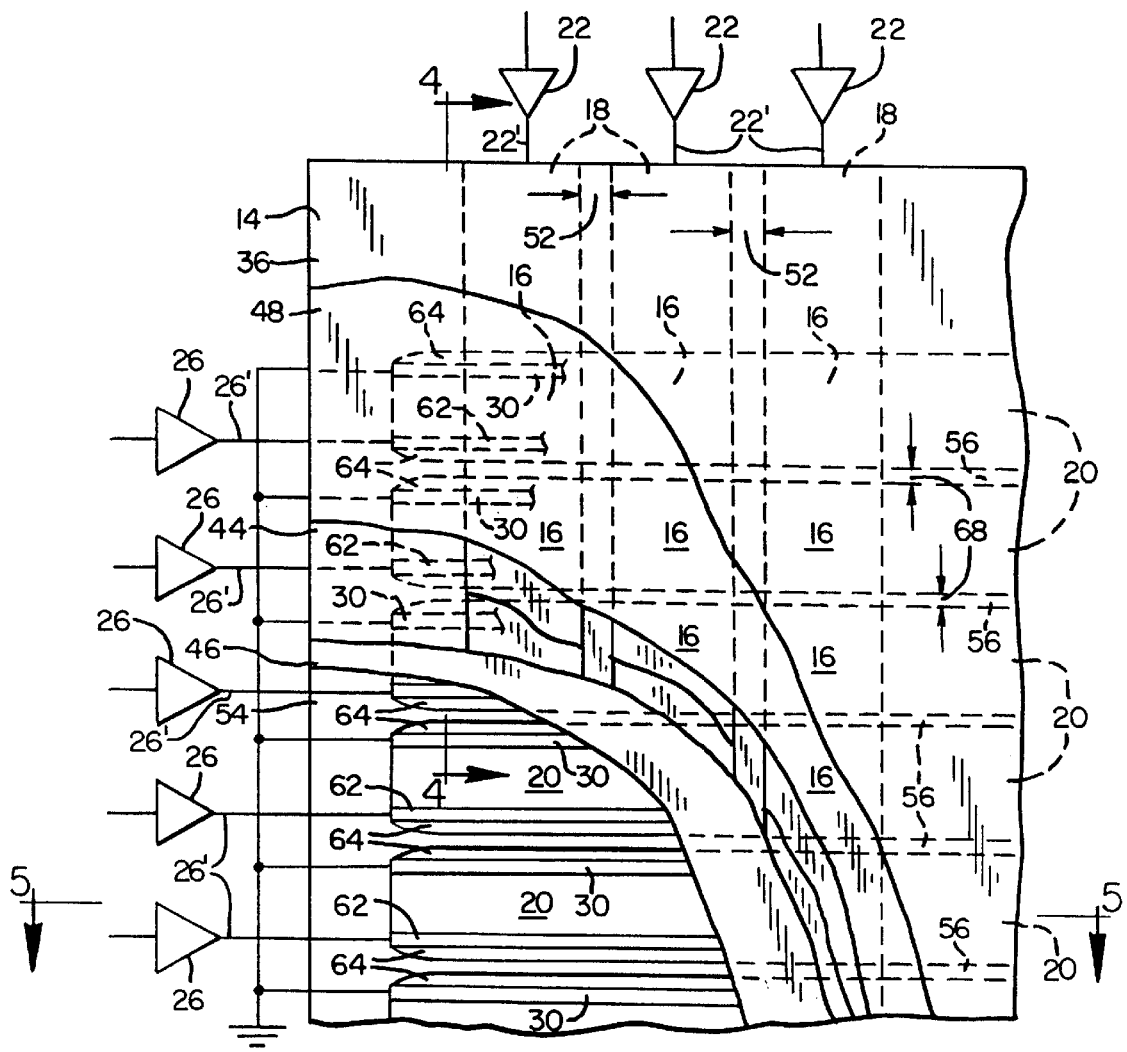
FIG. 3 is an enlarged fragmentary frontal view with portions broken away to show different depth-wise views of the interior of the prior art display panel of FIG. 2.

FIGS. 1–3 show a prior art flat panel display system 10, which comprises a display panel 12 having a display surface 14 that contains a pattern formed by a rectangular planar array of nominally identical data storage or display elements ("pixels") 16 mutually spaced apart by predetermined distances in the vertical and horizontal directions. Each display element or pixel 16 in the array represents the overlapping intersection of a thin, narrow, vertically oriented electrode 18 and an elongated, narrow, horizontally oriented plasma channel 20. (Electrodes 18 are hereafter referred to as "column electrodes 18.") All of the pixels 16 of a particular plasma channel 20 are set simultaneously when the inert gas in the plasma channel is sufficiently ionized. Each pixel is set to the potential gradient between the column electrode and ground at this time.

The widths of column electrodes 18 and plasma channels 20 determine the dimensions of pixels 16, which are of rectangular shape. Column electrodes 18 are deposited on a major surface of a first electrically nonconductive, optically transparent substrate, and plasma channels 20 are inscribed in a major surface of a second electrically nonconductive, optically transparent substrate. Skilled persons will appreciate that certain systems, such as a reflective display of either the direct view or projection type, would require that only one of the substrates be optically transparent.

Column electrodes 18 receive data drive signals of the analog voltage type developed on parallel output conductors 22' by different ones of the output amplifiers 22 (FIGS. 2 and 3) of a data driver or drive circuit 24, and plasma channels 20 receive data strobe signals of the voltage pulse type developed on output conductors 26' by different ones of output amplifiers 26 (FIGS. 2 and 3) from the output of strobe circuit 28. Each of the plasma channels 20 includes a reference or anode electrode 30 (FIGS. 2 and 3) to which a reference potential common to each plasma channel 20 and data strobe 28 is applied.

To synthesize an image on the entire area of display surface 14, display system 10 employs a scan control circuit 32 that coordinates the functions of data driver 24 and data strobe 28 so that all columns of pixels 16 of display panel 12 are addressed row by row in row scan fashion. Display panel 12 may employ electro-optic materials of different types. For example, if it uses such a material that changes the polarization state of incident light rays 33 (FIG. 2), display panel 12 is positioned between a pair of light polarizing filters 34 and 36 (FIG. 2), which cooperate with display panel 12 to change the luminance of light propagating through them. The use of a scattering liquid crystal cell as the electro-optic material would not require the use of light polarizing filters 34 and 36, however. A color filter (not shown) may be positioned within display panel 12 to develop multicolored images of controllable color intensity. For a projection display, color can also be achieved by using three separate monochrome panels 10, each of which controls one primary color.

With particular reference to FIGS. 2 and 3, display panel 12 comprises an addressing structure that includes a pair of generally parallel electrode structures 40 and 42 spaced apart by a layer 44 of electro-optic material, such as a nematic liquid crystal, and a thin layer 46 of a dielectric material, such as glass, mica, or plastic. Electrode structure 40 comprises a glass dielectric substrate 48 that has deposited on its inner surface 50 column electrodes 18 of indium tin oxide, which is optically transparent, to form a striped pattern. Adjacent pairs of column electrodes 18 are spaced apart a distance 52, which defines the horizontal space between next adjacent pixels 16 in a row.

Electrode structure 42 comprises a glass dielectric substrate 54 into which top surface 56 multiple plasma channels 20 of trapezoidal cross section with rounded side walls are inscribed. Plasma channels 20 have a depth 58 measured from top surface 56 to a base portion 60. Each one of plasma channels 20 includes a cathode electrode 62 in addition to anode electrode 30, both of which are thin and narrow. Each of these electrodes extends along the length of base portion 60 and one out of a pair of inner side walls 64 that diverge in the direction away from base portion 60 toward top surfaces 56.

The anode electrodes 30 of the plasma channels 20 are connected to a common electrical reference potential, which can be fixed at ground potential as shown. The cathode electrodes 62 of the plasma channels 20 are connected to different ones of the output amplifiers 26 (of which three and five are shown in FIG. 2 and FIG. 3, respectively) of data strobe 28. To ensure proper operation of the addressing structure, anode electrodes 30 and cathode electrodes 62 preferably are connected to the electrical reference potentials and the amplified outputs 26' of data strobe 28, respectively, on opposite edges of display panel 10.

The inner sidewalls 64 between adjacent plasma channels 20 define a plurality of support structures 66, the top surfaces 56 of which support thin layer 46 of dielectric material. Adjacent plasma channels 20 are spaced apart by a width 68 of the top portion of each support structure 66, which width 68 defines the vertical space between next adjacent pixels 16 in a column. The overlapping regions 70 of column electrodes 18 and plasma channels 20 define the dimensions of pixels 16, which are shown in dashed lines in FIGS. 2 and 3. FIG. 3 shows with better clarity the array of pixels 16 and the vertical and horizontal spacings between them.

The magnitude of the voltage applied to column electrodes 18 specifies the distance 52 to promote isolation of adjacent column electrodes 18. Distance 52 is typically much less than the width of column electrodes 18. The inclinations of inner side walls 64 between adjacent plasma channels 20 specify the width 68, which is typically much less than the width of plasma channels 20. The widths of column electrodes 18 and plasma channels 20 are typically the same and are a function of the desired image resolution, which is specified by the display application. It is desirable to make distances 52 and widths 68 as small as possible. In display panel 12, the channel depth 58 is approximately one-half the channel width.

Each of plasma channels 20 is filled with an ionizable gaseous mixture, generally a mixture of inert gasses. Thin layer 46 of dielectric material functions as an isolating barrier between the ionizable gaseous mixture contained within plasma channel 20 and layer 44 of liquid crystal material. The absence of thin layer 46 would, however, permit either the liquid crystal material to flow into plasma channel 20 or the ionizable gaseous mixture to contaminate the liquid crystal material. Thin layer 46 may be eliminated from displays that employ a solid or encapsulated electro-optic material.

Figure 4:
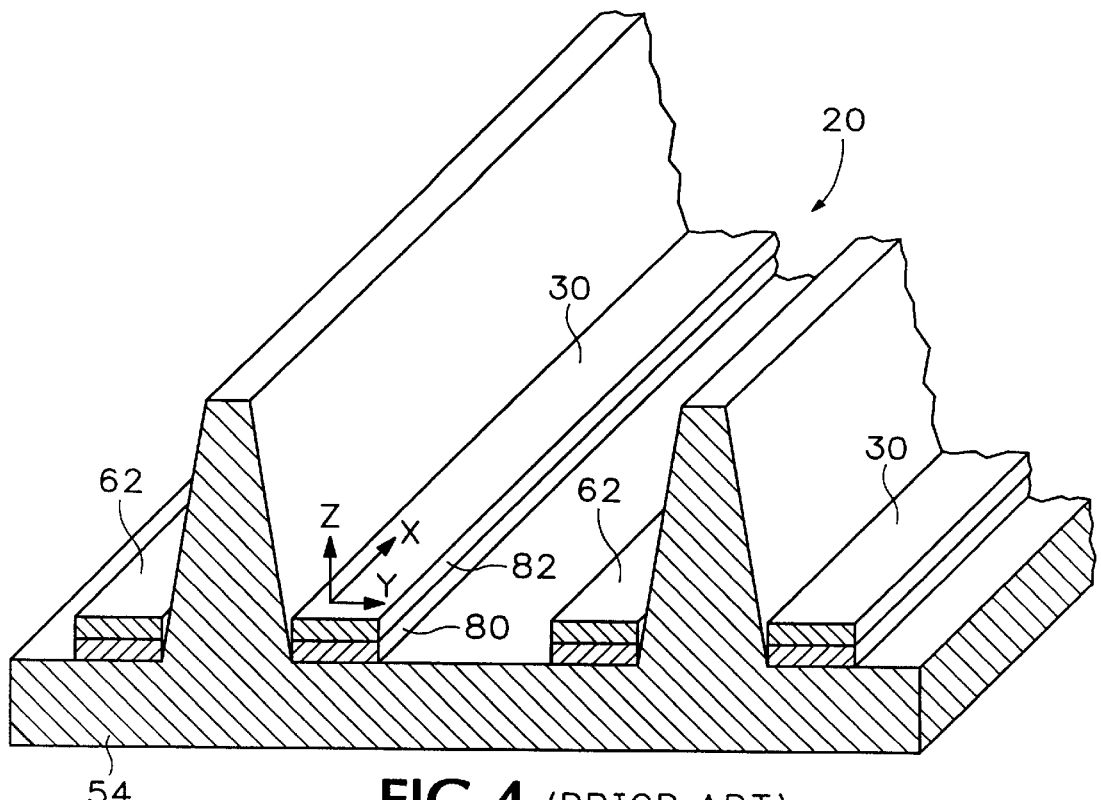
FIG. 4 is an oblique view of a fragment of the display panel of FIG. 2 enlarged to reveal details of a prior art plasma channel and its electrode structure.

FIG. 4 shows in greater detail prior art plasma channel 20 formed in glass substrate 54. Electrodes 30 and 62 are typically formed by well-known glass etching and additive thin film deposition techniques, such as sputtering, evaporative coating, electrophoretic or catophoretic deposition, and screen printing, all with or without a patterning mask. Of course, subtractive processes, such as laying down a conductive layer, photo patterning a resist layer, and etching or sand blasting away all but the desired pattern of the conductive layer may also be employed. The manufacturing process employed may be repeated to produce a multilayer electrode structure, such as the two layer electrodes shown in FIG. 4. For example, electrode 30 may be formed from a conductive layer 80 and an emissive layer 82.

Prior electrode structures, such as electrodes 30 and 62, are dimensionally and compositionally uniform in at least one of three orthogonal directions X, Y, and Z, where the X direction is defined as being parallel with the electrode surface and aligned with its length, the Y direction is defined as being parallel with the electrode surface and perpendicular to its length, and the Z direction is defined as being normal to the electrode surface. For example, although the composition of electrode 30 may vary in the Z direction (layers 80 and 82 are compositionally different), typical electrodes are compositionally homogenous in the X and Y directions and dimensionally uniform in the Y and Z directions. Skilled workers will understand that in the case of curved electrodes, the definitions of the X, Y, and Z directions are localized to small areas of the curved electrodes.

Improving the quality of a PALC display, such as flat panel display system 10 FIGS. 1–3), depends on improving many of the characteristics of the ionized gas discharge in plasma channel 20. Such improved characteristics include reduced firing voltages in one region of plasma channel 20 compared to another region, reduced sputtering damage of the cathode electrode, reduced total discharge current, decreased discharge initiation time, and decreased ionized gas decay time.

To improve these characteristics of the ionized gas discharge, this invention employs electrode structures that are nonuniform in at least one of the X, Y, and Z directions. Such nonuniform electrodes provide localized regions of preferential and non-preferential surface and bulk qualities of the electrodes, which produce the improved plasma discharge characteristics. The nonuniformities are classified into general categories including surface nonuniformities, bulk nonuniformities, and geometric nonuniformities.

Figure 5:
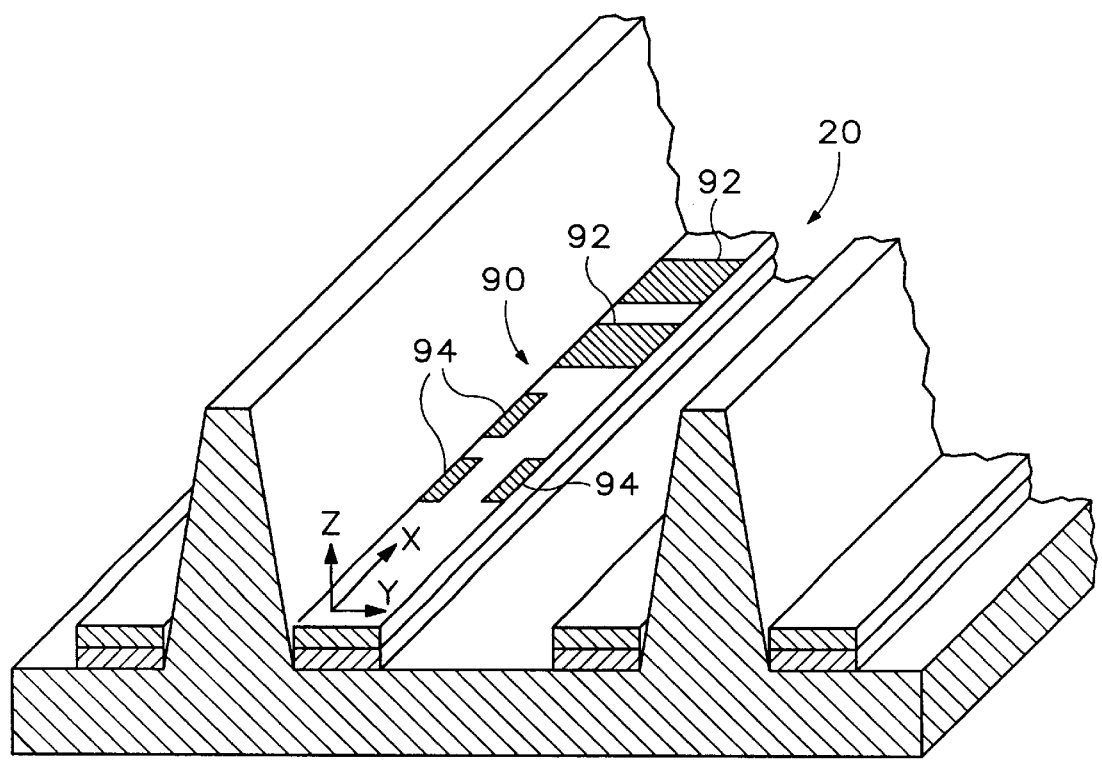
FIG. 5 is an oblique view of a fragment of the display panel such as the one shown in FIG. 2 enlarged to reveal details of a plasma channel and an electrode structure having nonuniform surface coatings according to this invention.

FIG. 5 shows plasma channel 20 with an improved electrode structure 90 having nonuniform surface coatings 92 and 94 according to the first category of this invention. Surface nonuniformities may include coating segments of electrode structure 90 in either of the X or Y directions to have, for example, a differentially increased or decreased secondary emission coefficient, work function, and/or resistivity. In this example, surface coatings 92 extend across the full Y direction of electrode structure 90, whereas surface coatings 94 extend across only part of distance Y of electrode structure 90. Therefore, surface coatings 92 are segmented in the X direction and surface coatings 94 are segmented in the X and Y directions.

Nonuniform surface coatings 92 and 94 may include, for example, highly secondary emissive surfaces such as magnesium oxide (MgO), insulating surfaces such as silicon dioxide ($SiO_2$), and field emissive surfaces such as negative electron affinity diamond films. Surface nonuniformities not need be dimensionally periodic, but may be randomly distributed in the X and Y directions, such as for doped diamond films in which the dopant concentration is not controlled.

Figure 6:
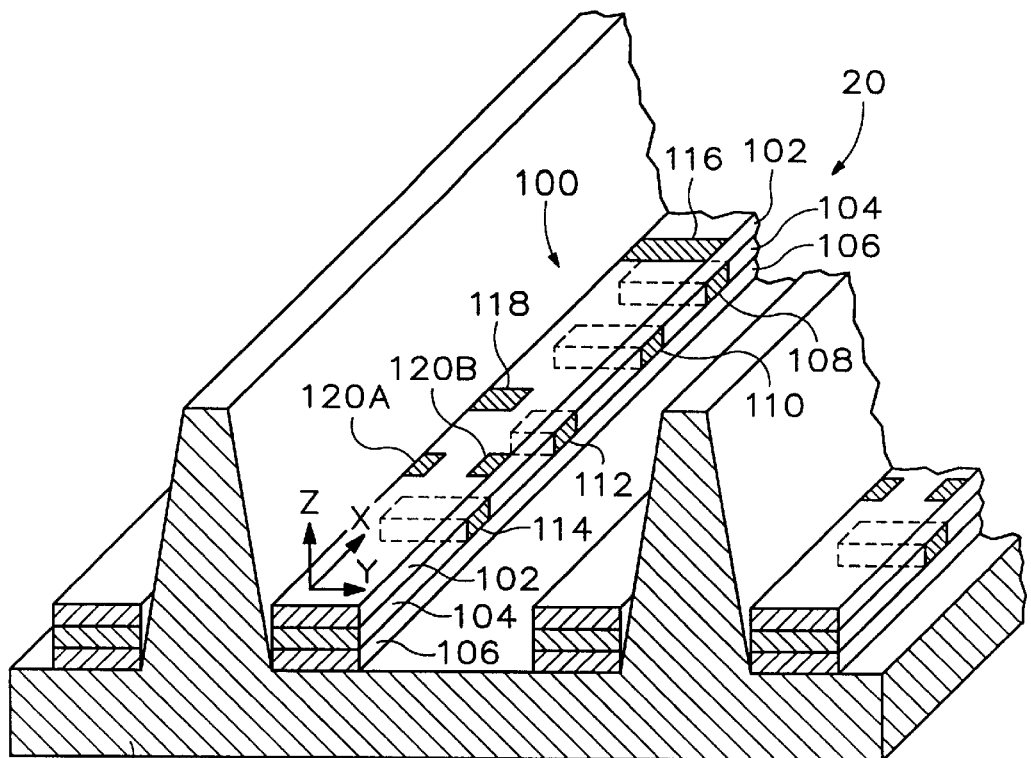
FIG. 6 is an oblique view of a fragment of the display panel such as the one shown in FIG. 2 enlarged to reveal details of a plasma channel and an electrode structure having nonuniform bulk and surface properties according to this invention.

FIG. 6 shows plasma channel 20 with an improved electrode structure 100 having three layers 102, 104, and 106, in which layer 104 includes bulk nonuniformities 108, 110, 112, and 114 according to the second category of this invention. Bulk nonuniformities may include electrode layers fabricated with different compositions in different regions such that the bulk properties of electrode structure 90, and not just its surface properties, vary in the Z direction in addition to the X and Y directions. Bulk nonuniformity 108 may be a resistive, insulating, or thermally conductive region in layer 104 aligned beneath an emissive surface coating 116. On the other hand, bulk nonuniformity 110 is not aligned with any particular surface coating.

FIG. 6 further shows bulk nonuniformity 112 aligned in the X direction, but not in the Y direction, beneath a surface nonuniformity 118. Bulk nonuniformity 114 is shown aligned in the X direction beneath a pair of surface nonuniformities 120A and 120B that are segmented in the Y direction. As with the surface nonuniformities, bulk nonuniformities may be periodically or randomly distributed in any combination throughout any of the layers forming improved electrode structure 100.

Figure 7:
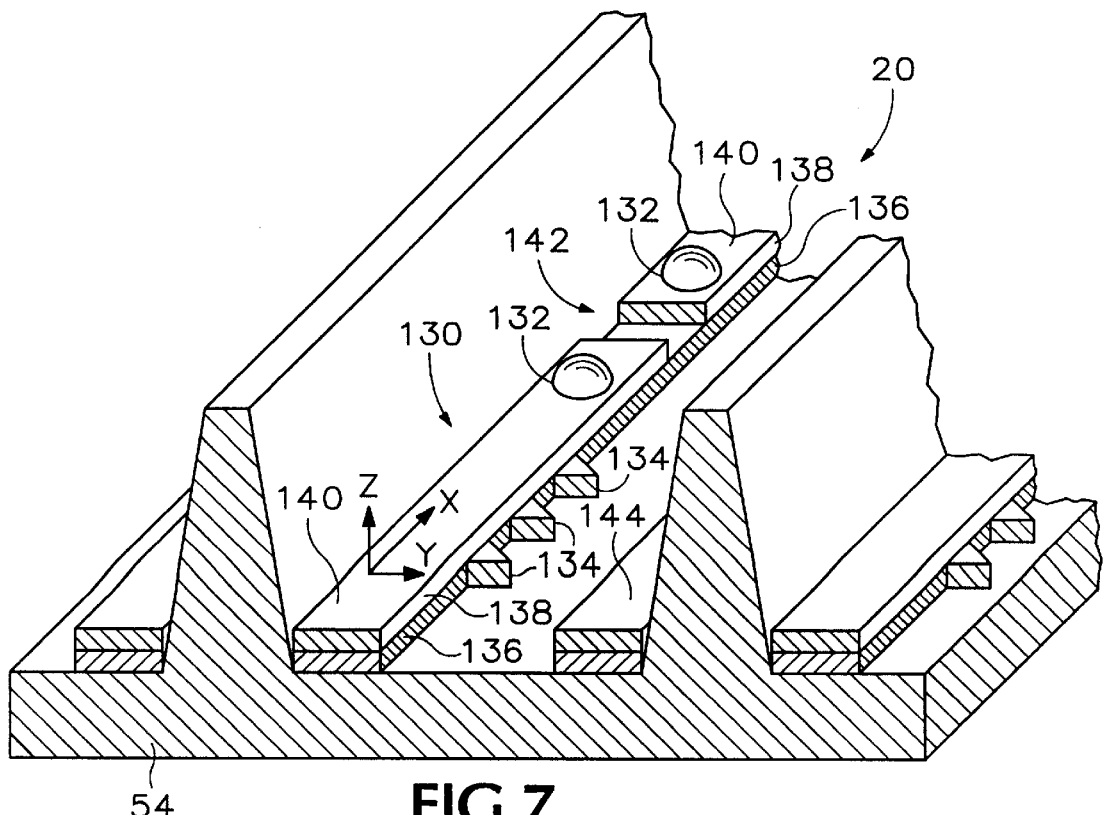
FIG. 7 is an oblique view of a fragment of the display panel such as the one shown in FIG. 2 enlarged to reveal details of a plasma channel and an electrode structure having nonuniform geometric shapes according to this invention.

FIG. 7 shows plasma channel 20 with an improved electrode structure 130 having geometric nonuniformities, such as bumps 132 and protrusions 134, according to the third category of this invention. Improved electrode structure 130 includes layers 136 and 138. Layer 138 further includes an upper surface 140 and a gap 142. Geometric nonuniformities include geometric shapes and voids applied to selected regions of an electrode in any of the X, Y, and Z directions. Exemplary geometric nonuniformities include bumps 132 or other raised surfaces on upper surface 140 of the electrode, distance variations in the Y direction between improved electrode structure 130 and an adjacent electrode structure 144, protrusions 134 from the electrode edges, or gaps in the electrodes (e.g., 142). Geometric nonuniformities serve to shape and contour potential gradients that, in turn, affect localized ionization voltages and currents. Such geometric nonuniformities may be periodic or random in their distribution over the volume of improved electrode structure 130.

Improved electrode structures 90, 100, and 130 of FIGS. 5–7 may be formed by well-known glass etching and additive thin film deposition techniques, such as sputtering, evaporative coating, or electrophoretic or catophoretic deposition with or without a patterning mask. Alternatively, subtractive processes may be employed, such as laying down a conductive layer, photo patterning a resist layer, and etching away or sand blasting all but the desired pattern of the conductive layer. This process may be repeated to produce multilayer electrode structures, such as those shown in FIGS. 5–7.

The above-described glass etching and thin film deposition processes represent only one set of manufacturing processes for making plasma addressing structures. Many other manufacturing processes may be employed, such as thick film, screen printing, and combinations of the above processes. Embodiments of PALC display electrode structures that are amenable to being made with such processes are described in U.S. Pat. No. 5,453,660, issued Sep. 26, 1995, for BI-CHANNEL ELECTRODE CONFIGURATION FOR AN ADDRESSING STRUCTURE USING AN IONIZABLE GASEOUS MEDIUM AND METHOD OF OPERATING IT, which is assigned to the assignee of this application and incorporated herein by reference. In such embodiments, the electrodes are typically formed by screen printing metallic conductors on a flat substrate. Additional layers, such as distribution buses and emissive layers, may be deposited or screen printed on top of the metallic conductors. Of course, curved surfaces and electrode shapes may also be employed and are suitable for use with this invention.

Skilled workers will recognize that portions of this invention may be implemented differently from the implementations described above for preferred embodiments. For example, any combination of surface, bulk, and geometric nonuniformities may be applied in a periodic or random distribution to a cathode electrode, an anode electrode, or both electrodes simultaneously. The combination of such nonuniformities provides electrodes that may, for example, fire at a lower voltage, minimize a current sourced from an electrode, and reduce the sputtering of an electrode. The design freedom associated with such nonuniformities provides a method of independently adjusting the firing voltage and other electrical properties of a sustained or interruptable plasma discharge, which improves the display uniformity, quality, power consumption, and life. PALC displays having improved electrode structures 90, 100, and 130 have improved quality because of reduced firing voltages in one plasma channel region compared to another, reduced sputtering damage, reduced total plasma discharge current, decreased discharge initiation time, and decreased ionized gas decay time.

The invention is described herein in a general way so that it may be employed in other plasma addressed devices, such as a video camera, megasample analog memory, and a display that uses an electrooptic effect other than liquid crystal, as well as AC and DC plasma display devices.

It will be obvious to those having skill in the art that many changes may be made to the details of the above-described embodiments of this invention without departing from the underlying principles thereof Accordingly, it will be appreciated that this invention is also applicable to electrode structures other than those found in PALC displays. The scope of this invention should, therefore, be determined only by the following claims.

We claim:

1. In a plasma addressed liquid crystal display apparatus, including a data element, an addressing structure including an ionizable gaseous medium, a data element that stores a data signal, and at least first and second electrode structures each having dimensions that extend in mutually orthogonal X, Y, and Z directions, wherein a potential difference between the first and second electrode structures ionizes the ionizable gaseous medium to provide an interruptible electrical connection between the data element and at least one of the first and second electrode structures to address the data element, an improved electrode structure comprising:

at least one of the first and second electrode structures having at least one of a surface nonuniformity, a bulk nonuniformity, and a geometric nonuniformity;

the surface nonuniformity extending in the X and Y directions on a region of a major surface of at least one of the first and second electrode structures;

the bulk nonuniformity extending in the X, Y, and Z directions within a region of a volume of at least one of the first and second electrode structures; and the geometric nonuniformity substantially varying at least one of X, Y, and Z dimensions of at least one of the first and second electrode structures.

2. The apparatus of claim 1 in which the first and second electrode structures are substantially elongated in the X direction and are substantially parallel to one another.

3. The apparatus of claim 1 in which the surface nonuniformity is a surface coating having at least one of a differentially changed secondary emission coefficient, a differentially changed work function, and a differentially changed resistivity than the major surface of at least one of the first and second electrode structures.

4. The apparatus of claim 1 in which the surface nonuniformity is at least one of a secondary emissive coating, an insulating coating, and a field emissive coating.

5. The apparatus of claim 4 in which the surface nonuniformity comprises at least one of a magnesium oxide coating, a silicon dioxide coating, a negative electron affinity diamond film, and a doped diamond film.

6. The apparatus of claim 5 in which the doped diamond film has a dopant concentration that is not controlled.

7. The apparatus of claim 1 in which there are multiple surface nonuniformities that are periodically distributed on the major surface of at least one of the first and second electrode structures.

8. The apparatus of claim 1 in which there are multiple surface nonuniformities that are randomly distributed on the major surface of at least one of the first and second electrode structures.

9. The apparatus of claim 1 in which the bulk nonuniformity is at least one of a resistive region, an insulating region, and a thermally conductive region.

10. The apparatus of claim 1 in which the electrode structures include at least first and second layers, the surface nonuniformity being on the first layer and the bulk nonuniformity being in the second layer and substantially aligned in at least one of the X and Y directions with the surface nonuniformity.

11. The apparatus of claim 1 in which the electrode structures include at least first and second layers and the surface nonuniformity is segmented in the Y direction on the first layer, the bulk nonuniformity being in the second layer and substantially aligned in the X direction with the segmented surface nonuniformity.

12. The apparatus of claim 1 in which there are multiple bulk nonuniformities that are periodically distributed within the volume of at least one of the first and second electrode structures.

13. The apparatus of claim 1 in which there are multiple bulk nonuniformities that are randomly distributed within the volume of at least one of the first and second electrode structures.

14. The apparatus of claim 1 in which the geometric nonuniformity is at least one of a bump, a raised surface, and a gap on the major surface of at least one of the first and second electrode structures.

15. The apparatus of claim 1 in which the geometric nonuniformity is a protrusion in the Y direction from an edge of at least one of the first and second electrode structures.

16. The apparatus of claim 1 in which the geometric nonuniformity provides a substantial distance variation in the Y direction between the first and second electrode structures.

17. The apparatus of claim 1 in which the geometric nonuniformity provides a periodic distance variation in the Y direction between the first and second electrode structures.

18. The apparatus of claim 1 in which there are multiple geometric nonuniformities that are periodically distributed throughout at least one of the first and second electrode structures.

19. The apparatus of claim 1 in which there are multiple geometric nonuniformities that are randomly distributed throughout at least one of the first and second electrode structures.

* * * * *